(12) United States Patent
Taniguchi

(10) Patent No.: US 6,310,680 B1
(45) Date of Patent: Oct. 30, 2001

(54) METHOD OF ADJUSTING A SCANNING EXPOSURE APPARATUS AND SCANNING EXPOSURE APPARATUS USING THE METHOD

(75) Inventor: Tetsuo Taniguchi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/465,696

(22) Filed: Dec. 17, 1999

Related U.S. Application Data

(63) Continuation of application No. 08/984,869, filed on Dec. 4, 1997, now abandoned.

(30) Foreign Application Priority Data

Dec. 6, 1996 (JP) .................................................. 8-326669

(51) Int. Cl.[7] ........................... G03B 27/42; G03B 27/54; G03B 27/72
(52) U.S. Cl. ................... 355/53; 355/67; 355/71
(58) Field of Search ........................... 355/53, 55, 67–77; 356/399–401; 250/548

(56) References Cited

U.S. PATENT DOCUMENTS

| 5,117,255 | 5/1992 | Shiraishi et al. | 355/53 |
| 5,459,547 | * 10/1995 | Shiozawa | 355/67 |
| 5,473,410 | 12/1995 | Nishi | 355/53 |
| 5,581,324 | 12/1996 | Miyai et al. | 355/53 |
| 5,591,958 | * 1/1997 | Nishi et al. | 250/205 |
| 5,677,754 | 10/1997 | Makinouchi | 355/53 |
| 5,739,899 | 4/1998 | Nishi et al. | 355/53 |
| 5,742,376 | * 4/1998 | Makinouchi | 355/33 |
| 5,760,881 | 6/1998 | Miyazaki et al. | 355/71 |
| 6,078,380 | * 6/2000 | Taniguchi et al. | 355/52 |

FOREIGN PATENT DOCUMENTS 6-349702   12/1994   (JP) .

* cited by examiner

Primary Examiner—Russell Adams
Assistant Examiner—Hung Henry Nguyen
(74) Attorney, Agent, or Firm—Oliff & Berridge, PLC

(57) ABSTRACT

A method and apparatus precisely adjust the image focusing characteristics of a projecting optical system of a scanning exposure apparatus. When the image focusing characteristics of the projecting optical system are measured, e.g., a fly eye lens for use in a normal scanning exposure process is switched to a fly eye lens composed of square-shaped lens elements thereby changing the slit-shaped illumination area of a reticle to a square-shaped illumination area. The positions and contrast of projected images of test marks in the square-shaped area are measured, thereby measuring the image focusing characteristics of the projecting optical system. According to the result of the measurement, e.g., an image focusing correction mechanism corrects the image focusing characteristics. After completion of adjusting the image focusing characteristics, the illumination area is returned to the normal illumination area and the image focusing characteristics are evaluated for confirmation. A further correction is made if the evaluation result indicates that further correction is required.

24 Claims, 7 Drawing Sheets

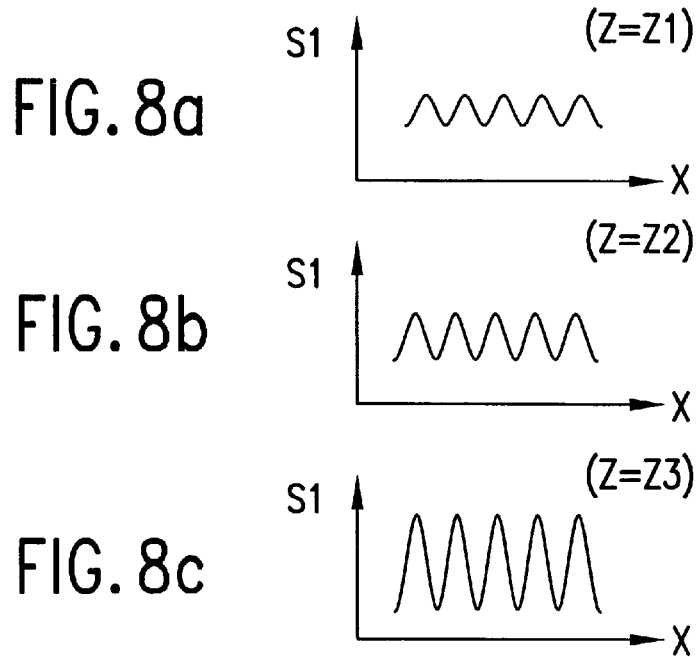
FIG. 8a
FIG. 8b
FIG. 8c
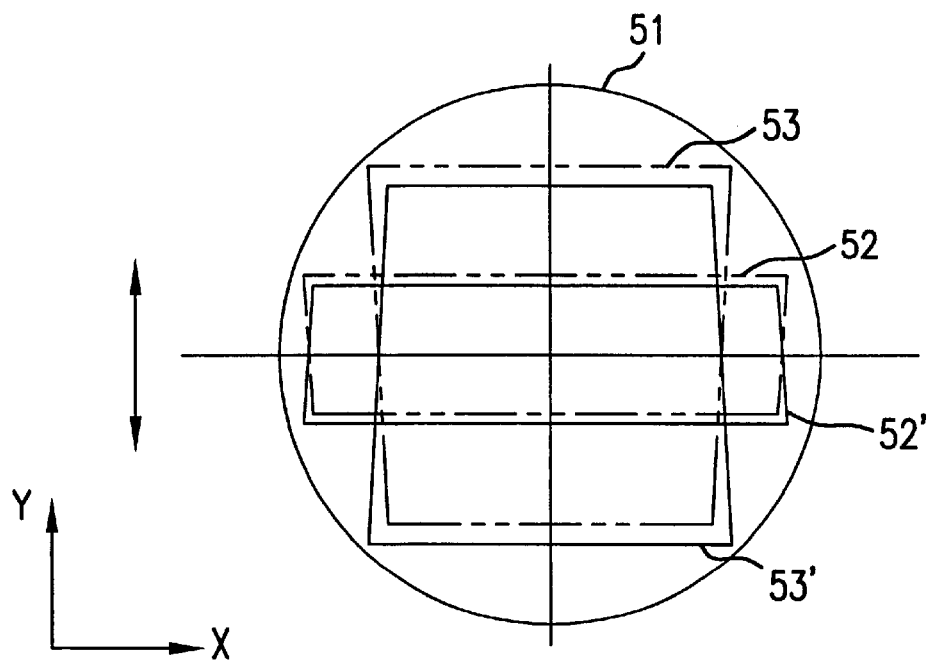
FIG. 9

METHOD OF ADJUSTING A SCANNING EXPOSURE APPARATUS AND SCANNING EXPOSURE APPARATUS USING THE METHOD

INCORPORATION BY REFERENCE

The disclosure of the following priority application is herein incorporated by reference: Japanese Patent Application No. 08-326669, filed Dec. 6, 1996.

This is a Continuation of application Ser. No. 08/984,869 filed Dec. 4, 1997 now abandoned. The entire disclosure of the prior application(s) is hereby incorporated by reference herein in its entirety.

BACKGROUND OF THE INVENTION

1. Field of Invention

The present invention relates to a method of adjusting a scanning exposure apparatus for transferring a pattern formed on a mask onto a photosensitive substrate during a photolithography process. The invention also relates to a scanning exposure apparatus using the above adjustment method. More particularly, the invention relates to a method suitable for adjusting the image focusing characteristics of the projecting optical system of the scanning exposure apparatus.

2. Description of Related Art

A one-shot type projection exposure apparatus (stepper using the step-and-repeat process) is widely used to produce a semiconductor device or the like. With this apparatus, an image of a pattern formed on a reticle serving as a mask is transferred, via a projecting optical system onto a photosensitive substrate. With the expansion of the pattern area of semiconductor chips, it becomes necessary to further expand the exposure area of the projection exposure apparatus used to produce these chips. However, a technical difficulty arises in simply expanding the exposure area while trying to keep good image focusing characteristics of the projecting optical system. Even if the expansion is possible, the resultant projection exposure apparatus would have a great size and would be prohibitively expensive.

One know technique of effectively expanding the exposure area without expanding the effective physical exposure field of the projecting optical system is to employ a step-and-scan projection exposure apparatus. In this technique, after stepping a wafer to a scanning start position, the wafer and a reticle are scanned synchronously relative to a projecting optical system. The reticle is illuminated by exposure light via a slit with a long and narrow rectangular shape or a circular arc shape. Thereby, the image of a reticle pattern is transferred onto a wafer from one shot area to another.

In the case of a scanning projection exposure apparatus, such as a step-and-scan exposure apparatus, the size of a circuit pattern formed on a wafer along the scanning direction is not limited by the size of the projecting optical system. On the other hand, the maximum pattern size (an area in which an image can be formed) in the direction perpendicular to the scanning direction is nearly equal to the diameter of the effective exposure field of the projecting optical system. Therefore, unlike the conventional one-shot projection exposure apparatus in which the available area is limited to a square or rectangle inscribed in the effective field of its projecting optical system, the scanning exposure apparatus has the ability of exposing a wider area to form a pattern.

Furthermore, in the scanning exposure apparatus, only a part of the effective exposure field of the projecting optical system is used. That is, in the slit-shaped exposure area, the image focusing characteristics, such as the distortion and the magnification error, of the projecting optical system can be kept within allowable ranges. As a result, it is possible to achieve high-accuracy image focusing characteristics associated with the transferred image over the entire shot area. In the conventional technique, when a scanning exposure apparatus is assembled and adjusted, a test pattern image is projected at each measurement point within the slit-shaped exposure area of the projecting optical system and the positions and contrast of the projected images are measured. In accordance with the result of the measurement, the image focusing characteristics of the projecting optical system are adjusted.

In the conventional scanning exposure apparatus, among various image focusing characteristics of the projecting optical system, random components independent of the distance from the optical axis are easy to adjust since the adjustment can be performed within a narrow area. On the other hand, for systematically varying components of the image focusing characteristics, such as those varying in proportion to the distance from the optical axis, the narrow measurement area results in less amount of information available for use in the adjustment. This makes it difficult for the scanning exposure apparatus to make a high-precision adjustment compared to the one-shot type (step-and-repeat) projection exposure apparatus.

Until recently, adjustment errors which occur in the conventional techniques were within allowable ranges. However, as the size of semiconductor devices becomes increasingly smaller, the image focusing characteristics of the projecting optical system become more critical. Thus, the conventional techniques of adjusting the image focusing characteristics of the projecting optical system have difficulty in achieving required characteristics.

SUMMARY OF THE INVENTION

In view of the above, it is an object of the present invention to provide a method for precisely adjusting a scanning exposure apparatus so that its projecting optical system has desired image focusing characteristics. It is another object of the present invention to provide a scanning exposure apparatus having the capability of making an adjustment according to the above method.

A first aspect of the present invention provides a method of adjusting a scanning exposure apparatus for transferring, via a projecting optical system PL, an image of a pattern formed on a mask (reticle) R onto a substrate W while synchronously scanning both the mask R and the substrate W with respect to illumination light IL. The method includes: (1) changing the illumination area of the illumination light IL to an area different from that used in a scanning exposure; (2) after changing the illumination area, projecting an image of a predetermined mask pattern via the projecting optical system PL and measuring the image focusing characteristics of the projecting optical system PL; and (3) adjusting the projecting optical system PL in accordance with the result of the measurement.

In the adjustment method according to the present invention, an area (second illumination area) used in the process of measuring the image focusing characteristics of the projecting optical system is set such that it is different from a mask illumination area employed in a scanning exposure process (first illumination area). The first illumination area of the scanning projection exposure apparatus is a limited area on the mask, such as a slit-shaped area. The image focusing characteristics measured in the limited area tend to include errors in components which vary systematically across the entire area of the effective exposure field of the projecting optical system. To avoid this problem, a larger area containing an area outside the above limited area is employed as the second area. With this enlarged area, it becomes possible to precisely make two-dimensional evaluations on the systematic components (e.g., distortion, curvature of field) of the image focusing characteristics of the projecting optical system PL. Thus, it becomes possible to precisely adjust the image focusing characteristics of the projecting optical system into a desired state based on the evaluation results.

The illumination area used in the scanning exposure process is, for example, a slit-shaped illumination area whose short sides extend in the scanning direction. When the image focusing characteristics of the projecting optical system PL are to be measured, the illumination area is switched to the area containing an area outside the slit-shaped illumination area thereby expanding the illumination area used to measure the image focusing characteristics of the projecting optical system PL. This ensures that the systematic components of the image focusing characteristics, such as those which vary depending on the distance from the optical axis, can be measured with high accuracy.

After the adjustment of the image focusing characteristics of the projecting optical system PL, the illumination area of the illumination light IL is returned to the normal illumination area used in the scanning exposure process. The image focusing characteristics of the projecting optical system PL preferably are then re-evaluated for confirmation. That is, a final confirmation is made on the image focusing characteristics in the normal illumination area used in the actual scanning exposure process. Even if some deviation in the image focusing characteristics is observed after the switching to the normal illumination area, it is possible to easily correct the deviation and thus prevent exposure from being performed under the deviated conditions.

According to another aspect of the present invention, there is provided a scanning exposure apparatus for transferring, via a projecting optical system PL, an image of a pattern formed on a mask R onto a substrate W while synchronously moving both the mask R and the substrate W with respect to illumination light IL generated by a light source. The scanning exposure apparatus includes: (1) an illuminating optical system capable of changing the illumination area of the illumination light generated by the light source; (2) a controller for controlling optical elements of the illuminating optical system PL so that the illumination area of the illumination light is set to a different area depending on whether the operation is in a measurement mode, in which the image focusing characteristics of the projecting optical system PL are measured, or in a scanning exposure mode; and (3) an adjustment system for adjusting the projecting optical system PL in accordance with the result of the measurement performed under illumination onto the illumination area during the measurement mode.

Preferably, the projection exposure apparatus further includes a sensor for detecting the image of a predetermined mask pattern projected via the projecting optical system PL and at least one calculating device for determining the image focusing characteristics of the projecting optical system PL on the basis of the detection result given by the sensor. The above predetermined mask pattern is, for example, a pattern that includes a plurality of test patterns distributed over the illumination area. When the positions and contrast of the projected images of these test patterns are detected by the sensor, it is possible to measure the distortion, the inclination of the image surface, and other characteristics of the projecting optical system PL with high accuracy.

Preferably, the illuminating optical system includes a field aperture for defining the illuminating area of the illumination light and the controller controls the field aperture so that the illumination area of the illumination light becomes different depending on whether the operation is in the measurement or scanning exposure modes. This makes it possible to precisely adjust the illumination area to a desired shape.

Preferably, the illuminating optical system also includes a plurality of switchable optical integrators that make the illumination light intensity distribution uniform. The optical integrators are switched between each other so that a proper one is selected depending on whether the operation is in the measurement mode or the scanning exposure mode. In the case where fly eye lenses are used as the optical integrators, the incidence surface of each fly eye lens is substantially conjugate with the mask plane. The illumination efficiency becomes maximum when the cross-sectional shape of each lens element of the respective fly eye lenses is substantially similar to the illumination area of the mask. Therefore, each fly eye lens is formed so that its cross-sectional shape is similar to the corresponding illumination area so that a high illumination efficiency is obtained in the scanning exposure process and so that the whole of the wide illumination area is illuminated in the process of measuring the image focusing characteristics.

These and other features and advantages of this invention are described in or are apparent from the following detailed description of the preferred embodiments.

BRIEF DESCRIPTION OF THE DRAWINGS

The preferred embodiments of this invention will be described in detail, with reference to the following figures, wherein:

FIGS. 8a–c illustrate detection signals obtained when the position of the spatial image sensor is varied in the Z direction;

FIG. 9 is a plan view illustrating the difference in distortion between two exposure areas in the effective exposure field of the projecting optical system;

FIG. 10b illustrates the position of the image surface measured in cross section passing through the optical axis shown in FIG. 10a.

DETAILED DESCRIPTION OF PREFERRED EMBODIMENTS

The present invention will be described in detail with reference to a preferred embodiment and the accompanying drawings. In this embodiment, the invention is applied to a method of adjusting the image focusing characteristics of a step-and-scan projection exposure apparatus.

Figure 3:
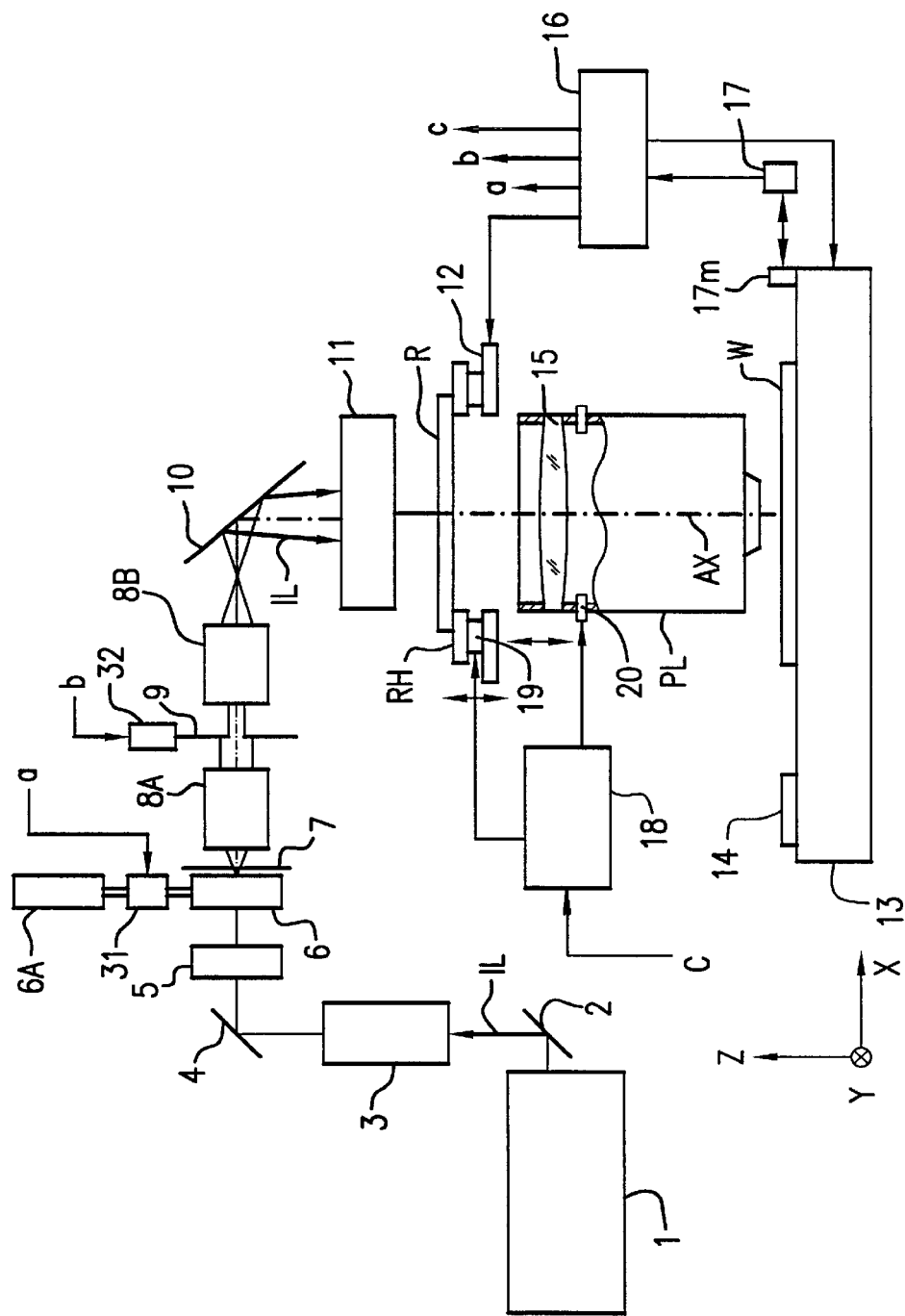
FIG. 3 is a partially cutaway schematic diagram illustrating the construction of a projection exposure apparatus employed in the present invention.

FIG. 3 is a partially cutaway schematic diagram illustrating the construction of the projection exposure apparatus employed in this embodiment. In FIG. 3, exposure illumination light IL emitted by an exposure light source 1 is bent by a mirror 2 and directed to a beam shaping unit 3 consisting of a lens system. The beam shaping unit 3 shapes the exposure illumination light IL so that its cross section has a desired size and shape. A proper luminescent line (such as a g-line or i-line) of light generated by a mercury lamp, an excimer laser, a metal vapor laser, YAG laser, or the like, may be employed as the illumination light IL. The illumination light IL shaped by the beam shaping unit 3 is bent by a mirror 4 to become incident on a first fly eye lens 5 serving as a first optical integrator. After passing through the first fly eye lens 5, the illumination light becomes incident, via a relay lens (not shown), on a second fly eye lens 6 which serves as a second optical integrator. These fly eye lenses 5 and 6 each include a plurality of lens elements arranged in a two-dimensional fashion so that a reticle is uniformly illuminated by superimposed light rays emerging from the light-emerging surfaces of the respective two-dimensionally arranged lens elements.

An aperture diaphragm 7 is disposed in front of the light-emerging surface of the second fly eye lens 6. The illumination light IL emerging from the second fly eye lens 6 passes through the aperture diaphragm 7 and passes through a relay lens 8A and a reticle blind 9 having a variable field aperture. After passing through the reticle blind 9, the illumination light IL passes through a relay lens 8B, a mirror 10 that bends the optical path, a focusing lens 11, and finally strikes a reticle R. The above-described optical elements from the mirror 2 to the focusing lens 11 disposed along the optical path form an illuminating optical system.

In an exposure process, a pattern formed on the reticle R is illuminated by the illumination light IL generated by the exposure light source 1 and projected via a projecting optical system PL onto a wafer W coated with a photosensitive material, so that a reduced pattern image is formed on the wafer W.

In the following description, X, Y, and Z axes are defined such that the Z axis is parallel to the optical axis AX of the projecting optical system PL. The X axis is taken so that it lies in a plane perpendicular to the Z axis and it extends in a direction parallel to the page of FIG. 3. The Y axis extends in a direction perpendicular to the page of FIG. 3. During the scanning exposure process, the reticle R and the wafer W are scanned in a direction parallel to the Y axis.

In the above-described structure, the reticle blind 9 includes, for example, four movable blades. A rectangular aperture is formed by edges of these four movable blades. Under the control of a main controller 16, the four movable blades are moved by a driving mechanism 32 so as to change the aperture to a desired shape. The reticle blind 9 is located in a plane conjugate with the pattern plane of the reticle R (reticle plane). The illumination area of the reticle R is ultimately determined by the aperture shape of the reticle blind 9. In the present embodiment, since the projection exposure apparatus is of the step-and-scan type, it is preferred that the width of the illumination area of the reticle R be gradually opened or closed at the beginning or the end of the scanning exposure process so that an unwanted pattern is prevented from being formed when the shot areas (exposure areas) of the wafer are scanned and exposed. To this end, the main controller 16 controls the driving mechanism 32 so that it properly opens and closes the reticle blind 9 in synchronization with the exposure operation.

During measurement of the image focusing characteristics of the projecting optical system PL, a square area of the reticle R is illuminated by the illumination light. The contour of the illumination area of the reticle R is determined substantially by the cross-sectional shape of each lens element of the second fly eye lens 6. Therefore, to illuminate the square-shaped illumination area of the reticle R, the second fly eye lens 6 should be replaced by a proper lens as will be described later. Additionally, the aperture size of the reticle blind 9 should be expanded by the driving mechanism 32. The illumination area of the reticle will be described in further detail below for both cases of the scanning exposure operation and the image focusing characteristic measuring operation.

Figure 2:
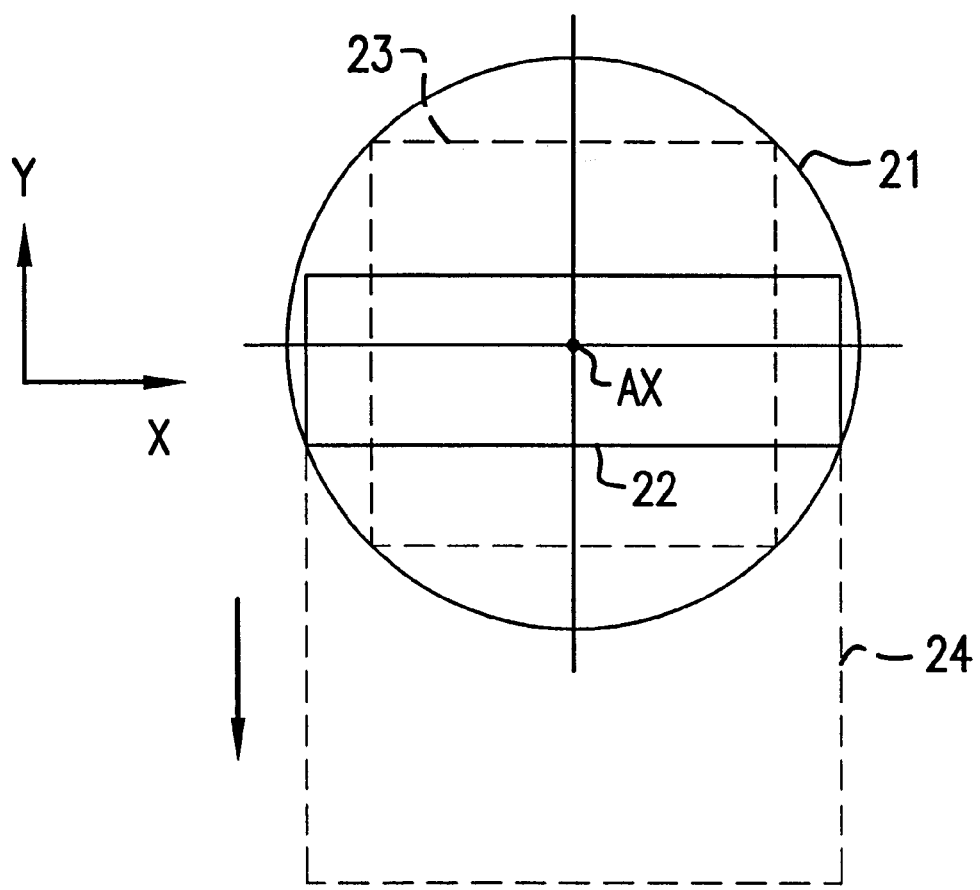
FIG. 2 is a schematic representation of two different illumination areas employed in a preferred embodiment of the invention.

FIG. 2 illustrates two illumination areas of the reticle R which are used in the present embodiment. In FIG. 2, the circle 21 represents an effective illumination area which is conjugate with the effective exposure field of the wafer W with respect to the axial-symmetry projecting optical system PL. In this embodiment, during a normal scanning exposure operation, the illumination area of the reticle R is selected so that the illumination area has a long and narrow rectangular shape (slit-shaped area) 22 inscribed in the effective illumination area 21. The reticle R is scanned, for example, in the +Y direction with respect to the illumination area 22 while the wafer W is scanned in the −Y direction in synchronization with the scanning of the reticle R so that the image of the pattern in the pattern area 24 of the reticle R is formed part by part on the wafer W.

To ensure that the illumination area can be set in the above-described manner, the mirror 10 is large enough to fully reflect the illumination light IL when the square-shaped illumination area 23 of the reticle R is illuminated by the illumination light IL. In the present embodiment, it is possible to easily switch the operation mode into the image focusing characteristic measuring mode simply by replacing the second fly eye lens 6 and expanding the aperture size of the reticle blind 9. This allows a reduction in the operation load. Alternatively, the reticle blind 9 may be removed instead of expanding the aperture size. Moreover, the mirror 10 may be formed to have a small size only capable of reflecting the illumination light IL to illuminate the slit-shaped illumination area 22 of the reticle R. The mirror 10 and the second fly eye lens 6 may be replaced by a mirror with a greater size when the aperture size of the reticle blind 9 is switched to the square-shaped illumination area 23. Because the replacing operation is performed only when the projecting optical system PL is adjusted, it is desirable that the replacing operation can be performed as easily as possible.

The operation of replacing the fly eye lens when the size of the illumination area of the reticle R is changed will now be described. In the structure shown in FIG. 3, the illumination light emerging from the respective lens elements of the first fly eye lens 5 illuminates the incidence surface of the second fly eye lens 6 in a superimposed fashion. Likewise, the illumination light emerging from the respective lens elements of the second fly eye lens 6 illuminates the reticle R in a superimposed fashion. With this technique, it is possible to achieve extremely uniform distribution of the intensity of illumination light over the surface of the reticle.

In this structure, the incidence surfaces of the respective lens elements of the second fly eye lens 6 are conjugate with the reticle plane. To enhance the illumination efficiency, each lens element of the second fly eye lens 6 is formed such that its cross-sectional shape is slightly greater than a long and narrow rectangle which is substantially similar to the illumination area 22.

Figure 4A:
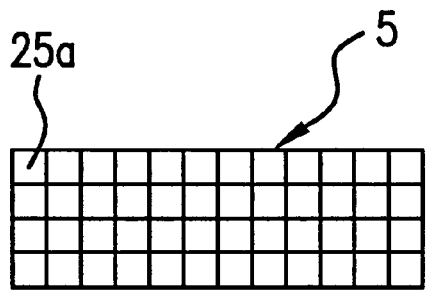
FIGS. 4a and 4b illustrate the light-emerging surfaces of two different fly eye lenses used in the projection exposure apparatus of FIG. 3.
Figure 4B:
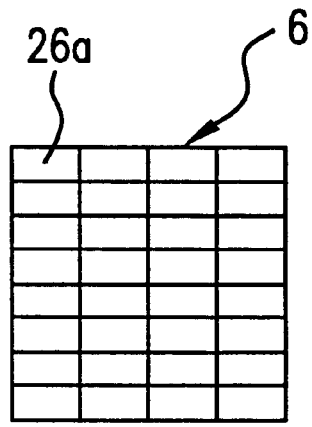

FIG. 4b illustrates the shape of the light-emerging surface of the second fly eye lens 6. As shown, the second fly eye lens 6 is composed of a great number of two-dimensionally arranged lens elements 26a having long and narrow rectangular cross sections. The light-emerging surface of the second fly eye lens 6 is conjugate with the pupil plane (the optical Fourier-transformed plane of the reticle plane) of the projecting optical system PL. To uniformly illuminate the pupil plane, the second fly eye lens 6 is formed so that its overall structure has an isotropic square cross section.

The incidence surfaces of the respective elements of the first fly eye lens 5 are conjugate with the incidence surface of the second fly eye lens 6. The light-emerging surface of the first fly eye lens 5 is also conjugate with the reticle plane. Therefore, to enhance the illumination efficiency, it is desirable that each lens element of the first fly eye lens 5 have a square shape in cross section geometrically similar to the cross section of the overall shape of the second fly eye lens 6, which is composed of elements having a long and narrow square shape geometrically similar to the slit-shaped illumination area 22.

Figure 5A:
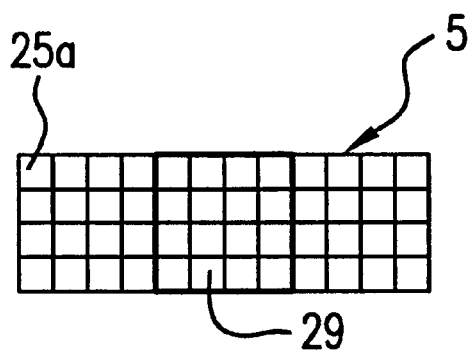
FIGS. 5a and 5b illustrate the light-emerging surfaces of two different fly eye lenses used when the projecting optical system is adjusted.

FIGS. 4a and 5a both illustrate the light-emerging surface of the first fly eye lens 5. As shown, the first fly eye lens 5 is composed of a great number of two-dimensionally arranged lens elements 25a having a square shaped cross with an overall shape of the first fly eye lens 5 being a long and narrow square shaped cross section. Thus, the cross sectional shape of the overall structure of the first fly eye lens 5 is geometrically similar to the slit-shaped illumination area 22 shown in FIG. 2 and the cross-sectional shape of each lens element 25a is geometrically similar to the cross sectional shape of the overall structure of the second fly eye lens 26. This results in a high illumination efficiency.

When the image focusing characteristics of the projecting optical system PL are measured, the illumination area of the reticle R is switched to the square illumination area 23. To illuminate the entire illumination are 23, the apparatus of the present embodiment has, for example, a rotary type exchanger 31 for switching the second fly eye lens 6 to a third fly eye lens 6A including a plurality of lens elements with a square shaped cross section.

Figure 5B:
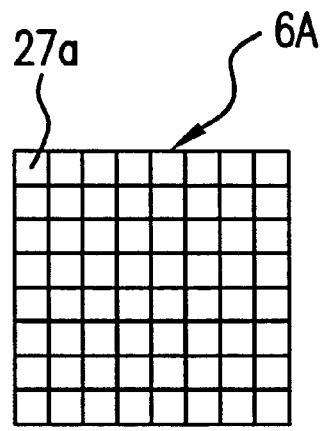

FIG. 5b illustrates the light-emerging surface of the third fly eye lens 6A. The third fly eye lens 6A is constructed such that it is composed of a great number of two-dimensionally arranged lens elements 27a having a square shaped cross section. The cross section of the overall structure also has a square shape. The cross section of each lens element 27a is geometrically similar to an area slightly greater than the square-shaped illumination area 23 used in the image focusing characteristic measurement so that the entire illumination area 23 is illuminated via the third fly eye lens 6A during the image focusing characteristic measurement. That is, in the image focusing characteristic measurement, the exchanger 31 places the third fly eye lens 6A in the optical path of the illumination light IL instead of the second fly eye lens 6.

It is not necessarily required that the fly eye lens be exchanged fully automatically. The exchange may be performed in a semiautomatic fashion in which final positioning is performed by a human operator. When the exchange is performed in the semiautomatic fashion, the fly eye lens 6 or 6A may be positioned using a positioning stopper or the like so that it is accurately positioned with high repeatability. To reduce the production cost of the projection exposure apparatus, the fly eye lenses 6 and 6A may be exchanged manually without using the exchanger 31.

When the third fly eye lens 6A is in the optical path, the light-emerging surface of the first fly eye lens 5 is kept conjugate with the reticle plane. This means that, of the illumination light emerging from the entire surface of the first fly eye lens 5, only the illumination light emerging through the square area 29 (denoted by a thick solid line in FIG. 5a) can arrive at the square illumination area 23. This results in a great reduction in the illumination efficiency (the amount of illumination light). This reduction in the illumination efficiency can be recovered by increasing the exposure time or adjusting the gain of the photosensor which will be described later.

The stage system of the projection exposure apparatus of the present embodiment will now be described. The recticle R can be moved together with a reticle holder RH in the scanning direction (in the Y direction) at a constant speed wherein the reticle R is placed, via the reticle holder RH, on a reticle stage whose position in the X and Y directions can be finely controlled. The position of the recticle stage 12 is precisely measured by a laser interferometer (not shown) and the measured values are supplied to the main controller 16. According to the measured values, the main controller 16 controls the scanning speed and the position of the reticle stage 12 via a driving system (not shown). Similarly, the wafer W is placed on a wafer holder (not shown) by means of suction. The wafer holder is firmly placed on a wafer stage 13 which can be moved at a constant speed in the scanning direction (in the Y direction) and which can also be stepped in the X and Y directions. The position of the wafer stage 13 is precisely measured by an external laser interferometer 17 via a moving mirror 17m fixed to the upper end of the wafer stage 13. The measured values are supplied to the main controller 16. According to the measured values, the main controller 16 controls the scanning speed and the position of the wafer stage 13 and wafer W via a driving system (not shown).

The wafer W is stepped, using the reticle stage 12 and the wafer stage 13, to the scanning start position of a shot area. The reticle R and the wafer W are then synchronously scanned with respect to the projecting optical system PL. The stepping and scanning operations are performed repeatedly in a step-and-scan fashion from one shot area to another thereby forming an image of the pattern of the reticle R onto each shot area of the wafer one by one.

Although not shown in the figures, there is provided a focusing position detector of the oblique incidence type for detecting the focusing position of the surface of the wafer W in the Z direction. The focusing position detector includes a light emitting optical system and a light detecting optical system located on either side of the projecting optical system. The information about the focusing position of the wafer W detected by the focusing position detector is supplied to the main controller 16. In the scanning exposure process, the main controller 16 drives the wafer stage 13 in accordance with the above information so that the surface of the wafer W is located in the image plane of the projecting optical system PL. That is, the position of the wafer W is automatically adjusted to the correct focusing position.

An aperture plate 14 is disposed on the wafer stage 13 at a fixed location near the wafer W so that the surface of the aperture plate 14 is located at the same height as the surface of the wafer W. The aperture plate 14 is made of a base plate transparent to the illumination light IL.

Figures 7A, 7B:
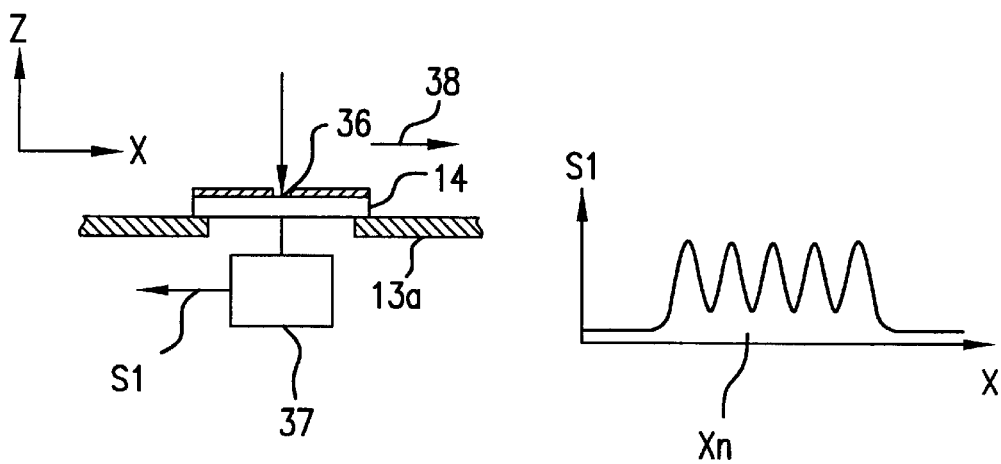
FIG. 7a is an enlarged cross-sectional view illustrating a spatial image sensor provided on the wafer stage of FIG. 3.
FIG. 7b illustrates a detection signal output by the photosensor of the spatial image sensor.

FIG. 7a is an enlarged schematic diagram illustrating the aperture plate 14. As shown, a light blocking film is formed on the surface of the aperture plate 14 which is firmly placed on the upper plate 13a of the wafer stage 13. The light blocking film has a long and narrow slit 36 extending in the Y direction and a long and narrow slit extending in the X direction (not shown). A photosensor 37, such as a photodiode or the like, is disposed below the slits. The aperture plate 14 and the photosensor 37 serve as a spatial image sensor used during the operation of measuring the image focusing characteristics of the projecting optical system PL. The photosensor 37 outputs a photoelectric conversion signal S1 and supplies this signal to a signal processing circuit in the main controller 16.

The projection exposure apparatus of the present embodiment includes a correction mechanism for correcting the image focusing characteristics. Three actuators 19, each including, for example, a piezoelectric element or the like and adapted to freely extend and contract, are disposed between the reticle holder RH and the reticle stage 12. Similarly, three actuators 20 adapted to freely extend and contract are disposed between a lens barrel and a lens holder for holding a lens element 15 located nearest to the reticle in the projecting optical system PL. Under the control of the main controller 16, an image focusing controller 18 controls the amounts of extension or contraction for the respective actuators 19. Thereby, the image focusing controller 18 finely adjusts the position of the reticle holder RH and the reticle R in the direction along the optical axis AX and also adjusts the inclination of the reticle holder RH within a predetermined range. Similarly, the position of the lens elements 15 in the direction along the optical axis AX and their inclination can be finely adjusted by controlling the amount of extension and contraction of the respective actuators 20. By performing these adjustments, it is possible to correct some errors of the image focusing characteristics associated with the projected image of the pattern of the reticle due to distortion, magnification error, the curvature of field, the inclination of the image surface, the astigmatic aberration, the coma aberration, and the like. Furthermore, the projecting optical system PL is adapted to be inclined to a certain degree so as to make a correction of the inclination of the image surface.

As for the mechanism for driving the reticle R or the lens elements 15, an automatic-control driving motor whose spindle is adapted to move up and down, a hand-operated micrometer, or an adjustment mechanism in which the number of washers disposed between elements is manually increased or decreased, e.g., may be employed instead of the piezoelectric element. Similarly, a mechanism that controls the gas pressure in a closed space between the two lens elements of the projecting optical system PL or the mechanism for separately driving two or more lens elements of the projecting optical system, e.g., may be employed as the mechanism for correcting the image focusing characteristics. When the above mechanisms are properly combined, it becomes possible to correct a greater number of image focusing characteristics.

The basic operation of adjusting the projecting optical system PL of the projection exposure apparatus will now be described. In the operation of adjusting the projecting optical system PL, the illuminating optical system is first adjusted so as to make it possible to observe an image projected via the projecting optical system PL. Then, the image focusing characteristics of the projected image are measured. The correction amounts of the image focusing characteristics are calculated from the measured values and corrections are made in accordance with the calculated correction values. After the corrections, the image focusing characteristics are measured again. In this way, the above process is performed repeatedly until the image focusing characteristics fall within predetermined ranges. In the step-and-scan exposure apparatus, it is required that a transferred image formed via a scanning exposure process should finally satisfy the specifications in terms of the image focusing characteristics. This means that the projecting optical system PL and the accuracy of the synchronous and relative rotational movement between the reticle R and the wafer W have influence on the final characteristics. The basic precondition is that the image focusing characteristics of the projecting optical system PL should satisfy the specifications when both the reticle R and the wafer W are at rest. A method of measuring the image focusing characteristics of the projecting optical system PL in a stationary state will be described below.

The image focusing characteristics of the projecting optical system PL to be measured include, for example, distortion, curvature of field, astigmatic aberration, coma aberration, and other characteristics. Of these characteristics, distortion and curvature of field are taken as examples and the method of measuring these characteristics will be described below. In the present embodiment, as described above with reference to FIG. 2, the slit-shaped illumination area 22 of the reticle is illuminated during the scanning exposure process, while the square-shaped illumination area 23 of the reticle is illuminated during the image focusing characteristic measurement process.

FIG. 9 illustrates a trapezoidal distortion which is one of various types of distortions which can occur in the projecting optical system PL. In FIG. 9, if it is assumed that the projecting optical system PL has no aberration, then the slit-shaped exposure area 52 in the circular-shaped effective exposure field 51 of the projecting optical system PL is conjugate with the slit-shaped illumination area 22 and the square-shaped exposure area 53 is conjugate with the square-shaped illumination area 23. If the projected image includes a trapezoidal distortion, then the exposure area 52 is distorted to a trapezoidal area 52', and the exposure area 53 is distorted to a trapezoidal area 53'.

If the image focusing characteristics are evaluated on the basis of the slit-shaped exposure area 52, the trapezoidal distortion from the area 52 to the area 52' is small. This makes it difficult to clearly detect the trapezoidal distortion. Even if the trapezoidal distortion can be detected, it is difficult to obtain a high enough accuracy in the measured distortion.

In contrast, when the image focusing characteristics are evaluated on the basis of the square-shaped exposure area 53, the trapezoidal distortion from the area 53 to the area 53' is great enough at both ends in the Y direction. That is, because the square-shaped exposure area 53 extends a greater distance from the optical axis in the scanning direction than the slit-shaped exposure area 52, the use of the square-shaped exposure area 53 makes it possible to precisely detect the systematic distortion which depends on the distance from the optical axis. In other words, if corrections are made in accordance with the image focusing characteristics measured in the slit-shaped exposure area 52, the correction accuracy becomes low compared with that obtained by corrections according to the image focusing characteristics measured in the square-shaped exposure area 53. For the above reason, in the present embodiment, the image focusing characteristics are measured in the squared-shaped exposure area 53. In the case of random distortion components that are independent of the distance from the optical axis, similar accuracy can be obtained regardless of whether the measurement is performed in the slit-shaped exposure area 52 or in the squared-shaped exposure area 53. The above discussion also holds true for distortions due to curvature of field.

Figure 10A:
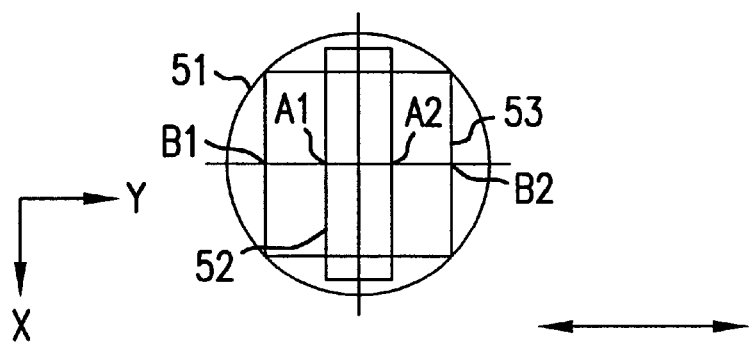
FIG. 10a is a plan view illustrating the effective exposure field of the projecting optical system.
Figure 10B:
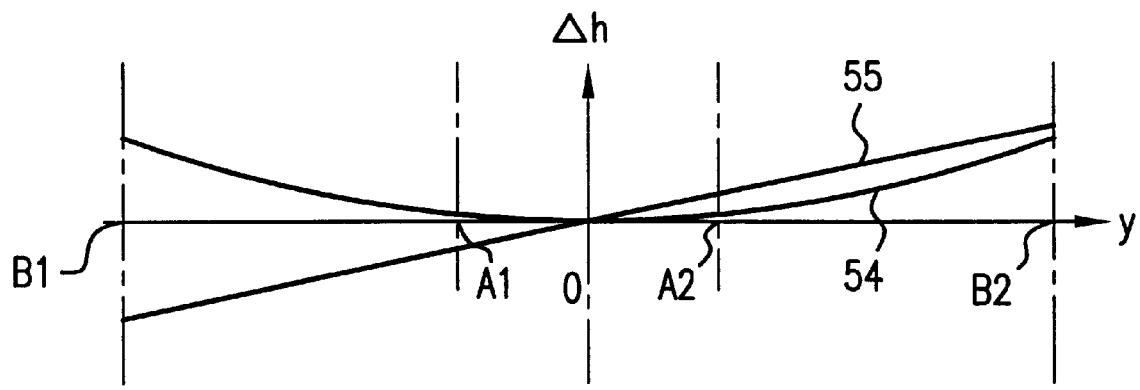

FIG. 10a illustrates the effective exposure field 51 of the projecting optical system PL. FIG. 10b illustrates the curvature of field (including the inclination of the image surface) measured in cross section of the effective exposure field 51 taken along a line passing through the optical axis and parallel to the scanning direction (Y direction). The horizontal axis represents the position y measured in the scanning direction (Y direction) from the optical axis. The vertical axis represents the displacement h of the image surface in the Z direction at the position y. The curvature of field is represented by a curve 54. The inclination of the image surface is represented by a straight line 55.

In the evaluation of the curvature of field, if the image focusing characteristics are measured in the slit-shaped exposure area 52 shown in FIG. 10a, the displacement h of the image surface at either end A1 or A2 of the area 52 in the scanning direction is smaller for both the curve 54 and the straight line 55. This means that when the image focusing characteristics are measured in the slit-shaped exposure area 52, it is difficult to surely determine whether the displacement originates from the curvature of field or from the inclination of the image surface. Even if it is possible to determine whether the displacement originates from the curvature of field or from the inclination of the image surface, it is difficult to make a precise quantitative measurement of the curvature of field and the inclination of the image surface in the scanning direction.

In contrast, when the image focusing characteristics are measured in the square-shaped exposure area 53, the displacement h of the image surface at either end B1 or B2 of the wide area 53 becomes large enough for both the curve 54 and the straight line 55 as shown in FIG. 10b. Thus, it is possible to measure the curvature of field relatively precisely over the entire exposure area 53. That is, as for the measurement of the curvature of field which greatly varies with the distance along the scanning direction, if the image focusing characteristics are measured in the square-shaped exposure area 53, it is possible to make a more precise measurement than can be achieved with the slit-shaped exposure area 52.

The basic operation of measuring the image focusing characteristics while illuminating the square-shaped illumination area 23 of the reticle shown in FIG. 2 is described below. In this case, the reticle R, shown in FIG. 3, is replaced by a test reticle on which a test mark is formed.

Figure 6A:
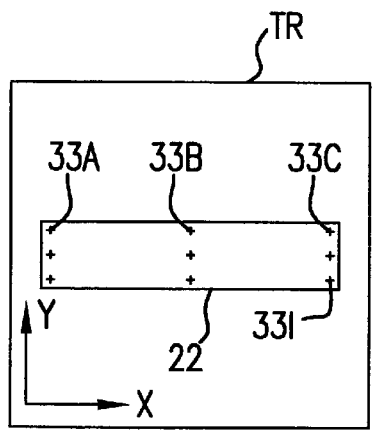
FIG. 6a is a plan view illustrating an array of test marks formed on a test reticle used in the present embodiment of the invention.
Figure 6B:
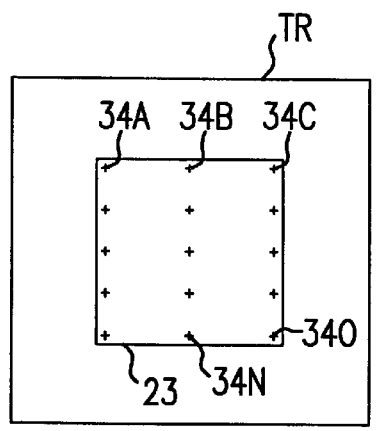
FIG. 6b is a plan view illustrating another array of test marks formed on the same test reticle.
Figure 6C:
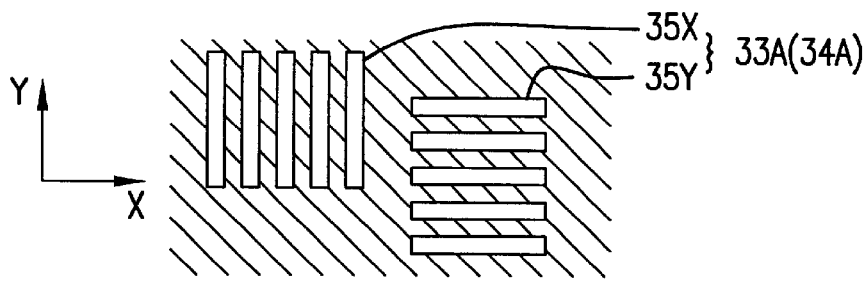
FIG. 6c is an enlarged plan view illustrating a test mark.

FIG. 6b is a plan view of the test reticle TR held on the reticle holder RH shown in FIG. 3. As shown, a large number of similar test marks 34A, 34B, 34C, . . . , 34O are formed in the square-shaped illumination area 23 of the test reticle TR so that they are spaced a predetermined distance apart from each other in the X and Y directions. The test mark 34A, as shown in FIG. 6c, includes five X-axis test marks 35X each made of a long and narrow opening formed in a light-blocking film in such a manner that the longer sides of each opening extend in the Y direction. The five X-axis test marks 35X are spaced a predetermined pitch from each other in the X direction. The test mark 34A also includes Y-axis test marks 35Y having a shape obtained by rotating the X-axis test marks 35X by 90 degrees. The positions of the test marks 34A, 34B, . . . , 34O formed on the test reticle TR are precisely measured beforehand by a coordinate measuring apparatus or the like and the measured values are stored in a memory of the main controller 16.

After the image focusing characteristics are measured by illuminating the square-shaped illumination area 23 shown in FIG. 2, the illumination area is switched to the slit-shaped illumination area 22 and the image focusing characteristics are measured again for confirmation. To this end, as shown in FIG. 6a, a great number of similar test marks 33A, 33B, 33C, . . . , 33I are formed in the slit-shaped illumination area 22 of the test reticle TR in such a manner that they are spaced a predetermined pitch from each other in the X and Y directions. The test mark 33A has the same shape as the test mark 34A shown in FIG. 6c. Some of the test marks 33A–33I and some of the test marks 34A–34O may be shared by each other. Furthermore, test marks may be included in a proper part of a transferring pattern formed on a normal exposure reticle (for example the reticle R shown in FIG. 3) so that the image focusing characteristics may be measured using these test marks.

After placing the test reticle TR on the reticle holder RH shown in FIG. 3, if the square-shaped illumination area 23 of the test reticle TR is illuminated by illumination light IL as shown in FIG. 6b, then images of the test marks 34A–34O are projected onto the wafer stage 13 via the projecting optical system PL. The positions of these images are detected by the spatial image sensor consisting of the aperture plate 14 and the photosensor 37. The distortion of the projected images is determined from the measured values.

An array is obtained by multiplying the known array of test marks 34A–34O by a designed value of projection magnification of the projecting optical system PL. The wafer stage 13 is driven in accordance with this array, so that the slit of the aperture plate 14, shown in FIG. 7a, comes to a location at a side of the predicted position of the projected images of the test marks 34A–34O. To detect the positions of the images of the X-direction test marks of the test marks 34A–34O, the wafer stage 13 is driven so that the images of the test marks are scanned by the slit 36 in the X direction and the detection signal S1 is output by the photosensor 37.

FIG. 7b illustrates the detection signal S1 obtained in the above-described manner. The signal processing circuit in the main controller 16 converts the detection signal S1 to a two-level signal with respect to a predetermined slice level. The mean value of the X coordinates Xn of five pulses is determined, thereby detecting the position of the image of the of X-direction test marks. Similarly, the Y coordinate of the image of the Y-direction test marks is detected by scanning the slit across the Y-direction test marks wherein the slit is formed in the aperture plate 14 such that it extends in the X direction. The X and Y coordinates of the images of the test marks can be measured very precisely using the laser interferometer 17 shown in FIG. 3. The main controller 16 then compares the measured X and Y coordinates of the projected images of the test marks 34A–34O with the designed array coordinates. This provides a quantitative high-precision detection of the distribution of position deviation, i.e. distortion, of the projected images across the exposure area corresponding to the square-shaped illumination area 23.

On the other hand, when the curvature of field is measured using the spatial image sensor, the square-shaped illumination area 23 of the test reticle R is illuminated. The contrast of the projected images of the test marks 34A–34O is detected by gradually changing the position of the wafer stage in the Z direction thereby changing the focusing position of the aperture plate 14. If the image of a certain test mark is scanned by the aperture plate 14 in the X direction (and also in the Y direction) and is detected by the photosensor 37 for various focusing positions of the aperture plate 14 such as Z1, Z2, Z3, . . . , then the contrast represented by the detection signal S1 generated by the photosensor 37 will be as shown in FIGS. 8a, 8b, and 8c. The best focused position Zi at which the contrast becomes maximum is regarded as the position of the image surface associated with the projected image of the test mark. If the position of the image surface is detected for each point in the exposure area conjugate with the square-shaped illumination area 23, then the distribution of the position of the image surface and thus the curvature of field can be measured. In the above process, if the difference between the position of the image surface associated with the X-direction test marks and the position of the image surface associated with the Y-direction test marks is calculated, the astigmatic aberration can also be detected.

Instead of using the spatial image sensor, the pattern image of the test reticle TR may be formed (test-printed) in a resist coated on a test wafer. The position of the resist pattern obtained by the development process may be measured using either a separate coordinate measuring apparatus or the projection exposure apparatus shown in FIG. 3 thereby detecting the distortion of the projected image.

Alternatively, distortion may also be measured without using the above-described test reticle TR. This is accomplished by performing an exposure process to form an image of a test reticle on a test wafer wherein the test reticle has test marks spaced a predetermined pitch from each other in the X and Y directions. Then, the wafer is moved in the X and Y directions by an amount corresponding to the pitch of the test marks. Exposure is performed again so that the wafer is exposed in a superimposed fashion. The above process is performed repeatedly and the deviations of positions of the superimposed resist images formed by development at various measurement points are added one by one thereby precisely measuring the distortion at a location far from the optical axis.

The curvature of field may also be measured using the test printing technique as follows. The first shot area of a test wafer is exposed to light of the image of the test reticle TR. Then, the wafer is stepped in the X or Y direction. After slightly changing the focusing position of the wafer, the second shot area of the wafer is exposed to light of the image of the test reticle TR. Similarly, the third and following shot areas are exposed to light of the image of the test reticle TR while the focusing position of the wafer is changed from one shot area to another. After performing development, an image having the highest contrast of all images is detected for each test mark thereby detecting the best focusing position for each test mark. Thus, the distribution of the position of the image surface is obtained.

A method of correcting the distortion and the curvature of field detected in the above-described manner is now described below. To correct the distortion, different techniques are used depending on the type or the component of the distortion. Thus, the distortion is first broken down into the respective components, such as, e.g., a magnification error, trapezoidal distortion, pincushion distortion, and barrel distortion.

In the case of the projection exposure apparatus shown in FIG. 3, the magnification error can be corrected by properly moving, along the optical axis AX, the projecting optical system's lens element 15 which is nearest the reticle R. The trapezoidal distortion can be corrected by properly tilting the lens element 15 relative to a plane perpendicular to the optical axis AX. On the other hand, the pincushion distortion and the barrel distortion can be corrected by adjusting the position of reticle holder RH (thus the position of the reticle R) in the direction along the optical axis AX. As can be understood from the above discussion, the distortion components which can be corrected by the above correction techniques are those which are symmetrical about the optical axis or about an axis slanted from the optical axis. A correction value is calculated for each distortion component so that the maximum error of the distortion at each point is minimized. Correction is made for each component in accordance with the calculated correction value.

To correct the curvature of field, the measured data of the position of the image surface is first broken down into components as in the case of the correction of distortion. Then, correction is made for each component. The position of the image surface includes an image surface inclination component, such as that represented by the straight line 55 in FIG. 10b, and an image surface curvature, such as that represented by the curve 54 in FIG. 10b. The image surface inclination can be corrected by properly slanting the projecting optical system PL. On the other hand, the image surface curvature can be corrected by properly moving the lens element 15 of the projecting optical system PL along the optical axis AX. However, if the lens element 15 is moved, the distortion is varied. To avoid this problem, a plurality of lens elements of the projecting optical system PL may be adapted to move so that the image surface curvature and the distortion may be corrected separately.

By way of example, the general process of adjusting the image focusing characteristics of the projecting optical system PL of the projection exposure apparatus will be described below with reference to the flow chart shown in FIG. 1.

Figure 1:
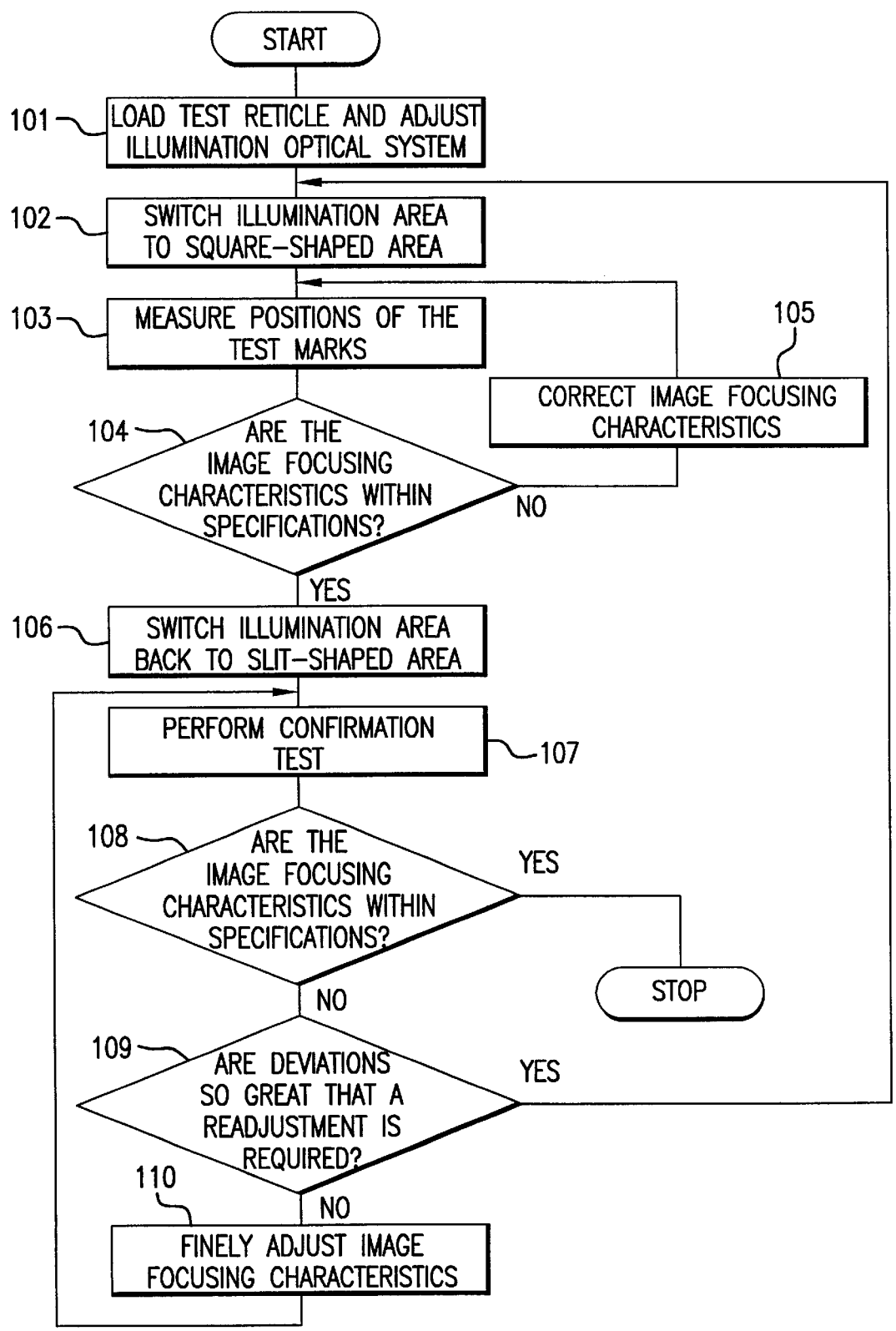
FIG. 1 is a flow chart illustrating the operation of one preferred embodiment of the present invention.

First, at step 101 in FIG. 1, the test reticle TR is loaded on the reticle holder RH, and the illuminating optical system is adjusted. More specifically, the uniformity of the intensity of illumination light IL across the reticle and the incidence angle to the reticle (telecentricity) are adjusted by slightly moving or slanting the fly eye lenses 5 and 6 and the relay lens 8A. Furthermore, the relay lens 8B is adjusted so that the light-emerging surface of the first fly eye lens 5 and the reticle plane become conjugate with each other.

Then in step 102, the illumination area is switched. Although the exposure apparatus of the present embodiment is of the step-and-scan type, the square-shaped illumination area 23 is employed to measure the image focusing characteristics only when the projecting optical system PL is adjusted. On the basis of the measured values, the image focusing characteristics are corrected for such components which depend on the distance from the optical axis and thus, which are symmetric about the optical axis or such components which are symmetric about an axis slanted from the optical axis. On the other hand, in the normal operation, to enhance the illumination efficiency, the slit-shaped illumination area 22 of the reticle is illuminated via the second fly eye lens 6.

In the adjustment process, the construction of the illuminating optical system is switched as follows. First, the second fly eye lens 6 is replaced by the third fly eye lens 6A via the exchanger 31. The third fly eye lens 6A is positioned by means of a precise and high-repeatability technique. Since the third fly eye lens 6A is composed of a plurality of lens elements 27a having a square-shaped cross section as shown in FIG. 5b, it is possible to illuminate the entire square-shaped illumination area 23 of the reticle via the third fly eye lens 6A. Furthermore, the aperture size of the reticle blind 9 is expanded by the driving mechanism 32 to the size corresponding to the illumination area 23. Alternatively, the reticle blind 9 may be removed. As for the mirror 10, there is not need to replace it because the mirror 10 has a larger enough size to fully illuminate the square illumination area 23 of the reticle R. However, in the case where the mirror 10 has a small size corresponding to the slit-shaped illumination area, it is also necessary to replace the mirror 10. The relay lenses 8A and 8B and the condenser lens 11 following the third fly eye lens 6A each have any axially symmetric structure and thus, there is no need to replace these elements.

Of the various components of the illumination light IL emerging from the first fly eye lens 5, only those which pass through the area 29 can arrive at the square-shaped illumination area 23. This results in a great reduction in the intensity of the illumination light. When the spatial image sensor is used, the reduction in the intensity of the illumination light can be compensated for by increasing the gain of the photosensor 37 by an amount corresponding to the reduction in the illumination light intensity. On the other hand, when the image focusing characteristics are measured using the test printing technique, the reduction in the illumination light intensity can be compensated for by increasing the exposure time. If it is desirable to avoid this reduction in the illumination light intensity, the beam shaping unit 3 and the first fly eye lens 5 may also be replaced by more appropriate ones.

When the adjustment is completed, it becomes possible to observe an image projected via the projecting optical system PL under illumination onto the square-shaped illumination area 23. Next, in step 103, using the spatial image sensor comprising the aperture plate 14 and the photosensor 37, the positions of the images of the test marks 34A–34O of the test reticle TR are measured. The images of test marks are measured for various focusing positions of the aperture plate 14. The best focusing position is determined for each test mark. From the measurement results, the image focusing characteristics of the projecting optical system PL, such as distortion and curvature of field, are determined. Then, in step 104, it is judged whether the measured image focusing characteristics fall within certain specifications of the image focusing characteristics. The specifications are determined taking into account the fact that the illumination area is expanded and that the illuminating optical system is different from that used in an actual exposure process to illuminate a reticle on which an actual circuit pattern is formed. That is, in order to make it unnecessary to perform a readjustment when the illuminating optical system is switched to one which is used in the actual exposure process, it is desirable that the tolerances of the specifications be equal to or more constraining than those required in the actual exposure process.

If it is concluded in step 104 that the image focusing characteristics do not satisfy the specifications, the process goes to step 105 and the image focusing controller 18 is driven so as to correct the image focusing characteristics of the projecting optical system PL. The steps 103 to 105 are performed repeatedly until the image focusing characteristics fall within the specifications.

If it is concluded in step 104 that the image focusing characteristics are within the specification, the process goes to step 106 and the illumination area is switched to the original slit-shaped illumination area 22. That is, the third fly eye lens 6A is replaced by the second fly eye lens 6, and the aperture size of the reticle blind 9 is switched to the size corresponding to the slit-shaped illumination area 22. In the above replacement process, the second fly eye lens 6 is positioned precisely using for example a positioning stopper.

Then in step 107, a final test is performed to confirm that the illumination characteristics (such as the illumination intensity distribution) of the illuminating optical system and the image focusing characteristics of the projecting optical system PL satisfy the specifications. Because the second fly eye lens 6 is positioned precisely as described above, substantially no changes occur, in most cases, in the illumination characteristics of the illuminating optical system. However, if some change in the illumination characteristics is observed, the positions of optical elements of the illuminating optical system are adjusted. When the illumination characteristics satisfy the predetermined specifications, the positions of the images of the test marks 33A–33I in the slit-shaped illumination area 22 of the test reticle TR and the best focusing positions for the respective images are measured as shown in FIG. 6a. On the basis of the measurement results, it is judged whether the image focusing characteristics of the projecting optical system PL satisfy the specifications. The above final test is required because there is a possibility that slight changes in the image focusing characteristics can occur due to the difference in the illumination area and also due to slight differences in the positions of the optical elements of the illuminating optical system.

Next, in step 108, it is judged whether the image focusing characteristics are within the predetermined specifications, on the basis of the above test result. If the image focusing characteristics do not satisfy the specifications, the process goes to step 109 and is judged whether the deviations are so great that a readjustment under illumination via the third fly eye lens 6A is required. The above judgment is made on the basis of the image focusing characteristics of the projecting optical system PL. That is, when it is concluded in step 109 that the deviations of the image focusing characteristics from the specification are great, the process returns to step 102 and the illumination area is switched to the square-shaped illumination area 23. Then steps 102 to 109 are performed repeatedly until the image focusing characteristics fall within the ranges in which no great deviations occur.

On the other hand, when it is concluded in step 109 that the image focusing characteristics are out of the specifications but the deviations are small, the process goes to step 110 and fine adjustments are made on the image focusing characteristics using the image focusing controller 18. The process returns to step 107, and steps 108–110 are performed repeatedly until the image focusing characteristics fall within the specifications. If it is concluded in step 108 that the image focusing characteristics are within the specifications, the adjustment of the projecting optical system PL is completed.

Although the step-and-scan method is employed in the present embodiment, the second fly eye lens 6 is replaced by the third fly eye lens 6A in step 102 so as to measure the image focusing characteristics under illumination onto the square shaped area 23. This ensures that the image focusing characteristics having a systematic dependence on the distance from the optical axis, such as the trapezoidal distortion, or having a symmetry about an axis slanted from the optical axis, such as the inclination of the image surface, are quantitatively measured with high precision. Thus, on the basis of the accurate measurement result of the image focusing characteristics, it is possible to correct the image focusing characteristics of the projecting optical system PL with the required specifications. The employment of the square-shaped illumination area 23 makes it possible to more precisely measure the image focusing characteristics having a systematic property and thus, it becomes possible to correct, in step 105, the image focusing characteristics with high accuracy. Therefore, in most cases, only a slight correction of the image focusing characteristics is required in the following step 109. Since the amount of correction required is small, the time required for the adjustment of the projecting optical system PL is short.

After completion of the correction of the image focusing characteristics of the projecting optical system PL in step 105, the illumination area is returned to the normal illumination area 22 in step 106. Therefore, it is desirable that the illumination area and the illumination characteristics be substantially the same as those employed in the actual exposure process. Therefore, the number of optical elements which are moved when the illumination area is switched should be as small as possible. In the embodiment, when the second fly eye lens is returned from the third fly eye lens 6A to the second fly eye lens 6, it is required that the position along the optical axis and the angle of the second fly eye lens 6 be precisely returned to the original values. To this end, the positioning stopper is used in the present embodiment so as to precisely return the second fly eye lens 6 to its original position and angle.

Furthermore, relative positions between the reference positioning plane of the third fly eye lens 6A and other optical elements are precisely controlled so that substantially no change occurs in the illumination characteristics when the second fly eye lens is switched to the third fly eye lens 6A for use in the adjustments.

To prevent the positional shifts among the optical elements when the illumination area is switched, the entire illuminating optical system may be replaced by an illuminating optical system for use in the adjustment. In the case where the adjustment of the projecting optical system PL is performed for example during the assembling and adjusting process of the projection exposure apparatus, the projecting optical systems of a large number of projection exposure apparatus can be adjusted using a common illuminating optical system for the adjustments.

As described above, the second fly eye lens 6 is replaced by the third fly eye lens 6A in an automatic or semiautomatic fashion using the exchanger 31. Alternatively, to reduce the production cost and simplify the structure of the projecting optical system, the replacement between the fly eye lenses 6 and 6A may be performed manually by a human operator. When the replacement of the fly eye lens is performed manually, it is desirable that a member having a reference positioning surface be provided so that the fly eye lens may be positioned with respect to the reference surface. It is also desirable that scales be provided on the reference positioning surface so that the fly eye lenses may be precisely positioned with reference to the scales.

Additionally, the illumination area used in the adjustment is not limited to a square-shaped area such as the illumination area 23. The effective exposure field 21 of the projecting optical system PL may be employed as the illumination area used in the adjustment. Alternatively, any illumination area may also be employed as long as its length along the scanning direction is greater than the corresponding length of the slit-shaped illumination area 22. As described above, the present invention is not limited to the details of the specific embodiment described above, but various variations and modifications are possible without departing from the scope of the invention.

The present invention, as described above, has various advantages. According to the adjustment method of adjusting the scanning exposure apparatus, an area (a second illumination area) used in the process of measuring the image focusing characteristics of the projecting optical system is set such that it is different from a mask illumination area employed in a scanning exposure process (a first illumination area). The first illumination area of the scanning projection exposure apparatus is a limited area on the mask and is conjugate with respect to the effective exposure field of the projecting optical system. If the image focusing characteristics are measured in the limited area, the measured values tend to include errors. To avoid the above problem, if a greater area containing an area outside the above limited area is employed as the second area, then it becomes possible to reduce the measurement errors associated with the systematic components of the image focusing characteristics, such as those which depend on the distance from the optical axis. Thus, it becomes possible to precisely adjust the image focusing characteristics of the projecting optical system into a desired state.

When a scanning exposure process is performed, the slit-shaped illumination area whose short sides extend in the scanning direction is used. When the image focusing characteristics of the projecting optical system are measured, the illumination area is switched to the area containing an area outside the slit-shaped area thereby ensuring that the systematic components of the image focusing characteristics can be measured with high accuracy.

After the adjustment of the image focusing characteristics of the projecting optical system, the illumination area of the illumination light is returned to the normal illumination area used in the scanning exposure process, and the image focusing characteristics of the projecting optical system are evaluated for confirmation. Even if some deviation in the image focusing characteristics is observed after the switching to the normal illumination area, it is possible to easily correct the deviation.

In the case where the projection exposure apparatus further includes a sensor for detecting the image of a predetermined mask pattern and a calculating device for determining the image focusing characteristics of the projecting optical system, it is possible to make a rapid measurement of the image focusing characteristics using the spatial image sensor without having to perform a test printing process.

The illuminating optical system includes the field aperture for defining the illuminating area of the illumination light. The controller controls the field aperture so that the illumination area is precisely set to a desired shape which is switched depending on whether the operation is in the measurement mode or in the scanning exposure mode.

Furthermore, the illuminating optical system also includes a plurality of switchable optical integrators for making the illumination light intensity distribution uniform. The optical integrators are switched between each other so that a proper one is selected depending on whether the operation is in the measurement mode or in the scanning exposure mode. This ensures that a high illumination efficiency is achieved in the normal scanning exposure process and the wide illumination area is fully illuminated in the measurement mode.

While this invention has been described in conjunction with specific embodiments thereof, it is evident that many alternatives, modifications and variations will be apparent to those skilled in the art. Accordingly, the preferred embodiments of the invention set forth herein are intended to be illustrative, not limiting. Various changes may be made without departing from the spirit and scope of the invention as defined in the following claims.

What is claimed is:

1. A scanning exposure apparatus for transferring, via a projecting optical system, an image of a pattern formed on a mask onto a substrate while synchronously moving both said mask and said substrate with respect to illumination light generated by a light source, said scanning exposure apparatus comprising:

an illuminating optical system having optical elements that define an illumination area of said illumination light generated by said light source when the exposure apparatus is operating in a scanning exposure mode;

a controller coupled to the illuminating optical system that changes the optical elements of said illuminating optical system so that said illumination area of the illumination light is set to have a different area depending on whether the scanning exposure apparatus is operating in a measurement mode or in the scanning exposure mode; and an adjustment system coupled to the controller that adjusts said projecting optical system in accordance with a result of a measurement performed on an area different from the illumination area used in the scanning exposure mode, while in the measurement mode.

2. The apparatus of claim 1, further comprising:

a sensor that detects the image of a predetermined mask pattern projected via the projecting optical system; and a calculating device coupled to the controller and to the sensor to determine image focusing characteristics of said projecting optical system on the basis of a detection result given by said sensor.

3. The apparatus of claim 1, wherein said illuminating optical system includes a field aperture that defines said illuminating area of the illumination light and said controller controls said field aperture so that the illumination area is set to a different area depending on whether the scanning exposure apparatus is operating in the measurement mode or in the scanning exposure mode.

4. The apparatus of claim 1, wherein said illuminating optical system includes a plurality of switchable optical integrators that make the illumination light intensity distribution uniform, and said optical integrators are switched between each other in such a manner that a proper integrator is selected depending on whether the scanning exposure apparatus is operating in the measurement mode or in the scanning exposure mode.

5. The apparatus of claim 4, wherein the optical integrators include a first fly eye lens and a second fly eye lens, each having an array of one or more lens elements.

6. The apparatus of claim 5, wherein the lens elements of the second fly eye lens have a long and narrow rectangular cross-section and wherein the array of lens elements of the second fly eye lens has a square shape overall.

7. The apparatus of claim 6, wherein the lens elements of the first fly eye lens have a square shaped cross-section and wherein the array of lens elements of the first fly eye lens has a long and narrow shape overall.

8. The apparatus of claim 5, wherein the controller switches the scanning exposure apparatus from the scanning mode to the measurement mode by replacing the second fly eye lens with a third fly eye lens and expanding the aperture size.

9. The apparatus of claim 8, wherein the third fly eye lens has an array of lens elements, the lens elements having a square shaped cross-section and wherein the array of lens elements has a square shape overall.

10. The apparatus of claim 9, wherein the controller replaces the second lens by the third lens automatically using an exchanging device.

11. The apparatus of claim 5, wherein the cross sectional shape of the overall structure of the first fly eye lens is geometrically similar to the illumination area and the cross-sectional shape of each lens element of the first fly eye lens is geometrically similar to the cross sectional shape of the overall structure of the second fly eye lens.

12. A scanning exposure apparatus for transferring, via a projecting means, an image of a pattern formed on a mask onto a substrate while synchronously moving both said mask and said substrate with respect to an illumination light, said scanning exposure apparatus comprising:

illuminating optical means for defining an illumination area of said illumination light when the exposure apparatus is operating in a scanning exposure mode; and control means for changing the illuminating optical means so that said illumination area of the illumination light is set to have an area different from the illumination area used in the scanning exposure mode, when the scanning exposure apparatus is operating in a measurement mode.

13. The apparatus according to claim 12, further comprising:

sensing means for sensing an image of a predetermined mask pattern projected via the projecting optical means in the measurement mode; and determining means for determining image focusing characteristics of said projecting optical means on the basis of a detection result given by said sensing means.

14. The apparatus according to claim 12, wherein said illuminating optical means includes an aperture for defining said illuminating area and said control means controls said aperture so that the illumination area is set to a different area depending on whether the scanning exposure apparatus is operating in the measurement mode or in the scanning exposure mode.

15. The apparatus according to claim 12, wherein said illuminating optical means includes a plurality of integrating means for making an illumination light intensity distribution of the illuminating optical means uniform and wherein said integrating means are switched between each other in such a manner that a proper integrating means is selected depending on whether the scanning exposure apparatus is operating in the measurement mode or the scanning exposure mode.

16. An exposure apparatus for transferring, via a projecting optical system, an image of a pattern formed on a mask onto a substrate using an illumination light generated by a light source, said exposure apparatus comprising:

an illuminating optical system having optical elements that define an illumination area of said illumination light generated by said light source when the exposure apparatus is operating in an exposure mode; and a controller coupled to the illuminating optical system that changes the optical elements of said illuminating optical system so that said illumination area of the illumination light is set to have an area different from the illumination area used in the exposure mode, when the exposure apparatus is operating in a measurement mode.

17. The apparatus of claim 16, further comprising:

an adjustment system coupled to the controller that adjusts said projecting optical system in accordance with a result of a measurement performed while in the measurement mode.

18. The apparatus of claim 17, wherein the adjustment system drives an element that forms a part of the projecting optical system.

19. The apparatus of claim 17, wherein the adjustment system drives the mask in an optical axis direction.

20. The apparatus of claim 16, wherein the exposure apparatus is a scanning exposure apparatus that moves said mask and said substrate synchronously to transfer the pattern onto the substrate.

21. The apparatus of claim 16, wherein the illumination area in the measurement mode is larger than the illumination area in the exposure mode.

22. An exposure apparatus that forms an image on an object, comprising:

an illumination optical system, having optical elements, that defines an illumination area of illumination light generated by a light source when the exposure apparatus is operating in an exposure mode;

a controller coupled to the illumination optical system that changes the optical elements of the illumination optical system so that a first illumination area in a measurement mode includes a second illumination area in the exposure mode; and an adjustment system coupled to the controller that adjusts the image formed on the object in accordance with image focusing characteristics of a projecting optical system measured by the second illumination area.

23. The apparatus of claim 22, wherein the adjustment system drives an element that forms a part of the projecting optical system to adjust the image formed on the object.

24. The apparatus of claim 22, wherein the adjustment system drives a mask in an optical axis direction to adjust the image formed on the object.

* * * * *